United States Patent [19]

Damiano et al.

[11] Patent Number: 4,649,302

[45] Date of Patent: Mar. 10, 1987

[54] DC OR AC SOLID STATE SWITCH WITH IMPROVED LINE-DERIVED CONTROL CIRCUIT POWER SUPPLY

[75] Inventors: Michael A. Damiano, Germantown; Richard F. Schmerda, Oak Creek, both of Wis.

[73] Assignee: Eaton Corporation, Cleveland, Ohio

[21] Appl. No.: 870,661

[22] Filed: Jun. 2, 1986

Related U.S. Application Data

[63] Continuation of Ser. No. 636,032, Jul. 30, 1984.

[51] Int. Cl.$^4$ .......................................... H03K 17/687
[52] U.S. Cl. .................................. 307/584; 307/571; 307/311; 323/351
[58] Field of Search .............. 323/235, 237, 245, 319, 323/320, 323, 351; 307/252 A, 252 N, 311, 571, 584, 598

[56] References Cited

U.S. PATENT DOCUMENTS

| | | | |
|---|---|---|---|
| 3,723,769 | 3/1973 | Collins | 307/311 |
| 3,881,118 | 4/1975 | Forrest et al. | 307/252 N |
| 4,438,356 | 3/1984 | Fleisher | 307/571 |
| 4,500,802 | 2/1985 | Janutka | 307/571 |
| 4,528,494 | 7/1985 | Bloomer | 323/235 |
| 4,567,425 | 1/1986 | Bloomer | 323/235 |

FOREIGN PATENT DOCUMENTS

| | | | |
|---|---|---|---|
| 2836325 | 2/1980 | Fed. Rep. of Germany | 363/45 |
| 141771 | 11/1981 | Japan | 323/320 |

Primary Examiner—William H. Beha, Jr.
Attorney, Agent, or Firm—D. A. Rowe; W. A. Autio

[57] ABSTRACT

A solid state switch (SS) for controlling a load (1) supplied from either an alternating current (AC) or a direct current (DC) power supply line (L1, L2) having a pair of solid state devices (FET1, FET2) for controlling energization of the load and a common control circuit (CC) therefore which includes a diode isolated, capacitive-reactively coupled, line-derived power supply circuit (PSC) for the common control circuit and an opto-isolated logic signal input circuit (ISO) such power supply circuit effectively eliminating the need for transformers or the line.

7 Claims, 3 Drawing Figures

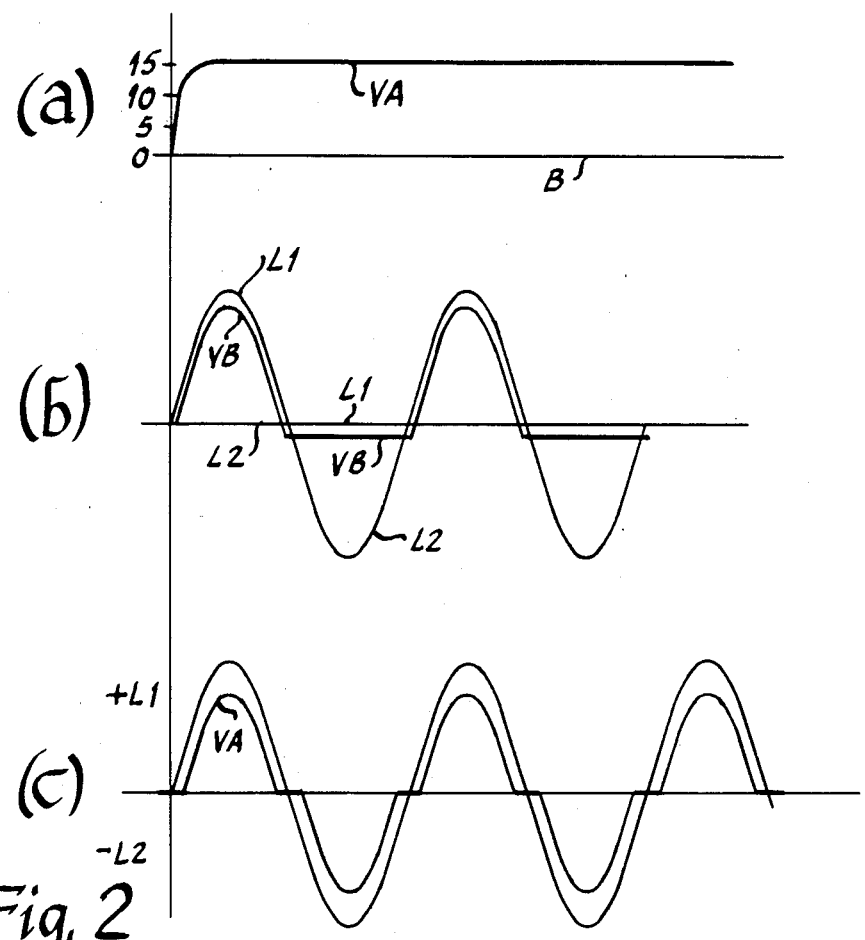
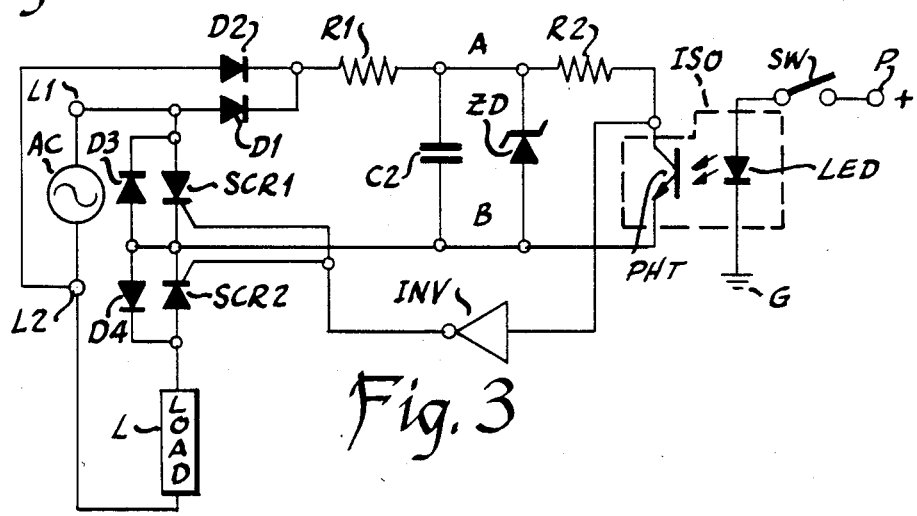
Fig. 2
Fig. 3

DC OR AC SOLID STATE SWITCH WITH IMPROVED LINE-DERIVED CONTROL CIRCUIT POWER SUPPLY

This is a continuation of application Ser. No. 636,032, filed July 30, 1984.

BACKGROUND OF THE INVENTION

Solid state switches have been known heretofore. However, prior solid state switches have been constructed so as to limit operation of such switches to A.C. or D.C., respectively, and not providing for operation of the same switch on either A.C. or D.C. Also, such prior solid state switches have been handicapped in that the interface between the logic or control circuit of the switch and the power supply line was complex. It has also been known in the prior art that D.C. operation of a FET may be accomplished by a line-derived power supply as, for example, is illustrated by the circuit in FIG. 22, page A-47 of the 1982–83 International Rectifier HEXFET Data Book. Bi-directional A.C. switches have also been known heretofore as, for example, is illustrated in FIG. 5, page A-50, of the aforementioned Data Book. However, problems have been encountered in attempting to use the simple D.C. control power supplies with the A.C. switch. These attempts have led to complicated power supply schemes such as, for example, that shown in FIG. 6, page A-126, and FIG. 6, e A-129 of the aforementioned Data Book. Such problems have arisen due to the necessity of maintaining a minimum of 10 volts and a maximum of 20 volts gate-to-source in order to properly control the FETs; therefore, it has been necessary to provide transformer coupled power supplies to prevent such 20 volt maximum from being exceeded which, if allowed to occur, might render the circuit inoperative.

SUMMARY OF THE INVENTION

An object of the invention is to provide an improved solid state switch with control circuit and line-derived power supply therefor.

A more specific object of the invention is to provide a solid state switch of the aforementioned type that is operable on either A.C. or D.C.

Another specific object of the invention is to provide a solid state switch with an improved line-derived power supply that is simple in construction and efficient in operation.

Another specific object of the invention is to provide a solid state switch with an improved line-derived power supply that does not use transformers or the like.

Another specific object of the invention is to provide a solid state switch operable on either A.C. or D.C. with an improved control circuit that includes a line-derived power supply and an opto-isolated logic input.

Another specific object of the invention is to provide a solid state switch operable to control either A.C. or D.C. with an improved line-derived power supply for its control circuit that includes capacitive reactance voltage dropping means.

Another specific object is to provide an A.C. solid state switch with an improved diode-isolated capacitive-reactively coupled line-derived power supply.

Another specific object is to provide an A.C. solid state switch that includes a pair of FETs as switching means and a common opto-isolated control circuit therefor powered from a line-derived power supply.

Other objects and advantages of the invention will hereinafter appear.

These and other objects of the invention are obtained by providing a solid state switch having an improved line-derived control circuit power supply and being operable to control either a D.C. or A.C. load supplied from a respective D.C. or A.C. electrical power supply source comprising a pair of power supply terminals to which either said D.C. or A.C. electrical power supply source is connected, a pair of solid state switching means connected in series with each other and said power supply terminals and said D.C. or A.C. load and being opposed with respect to one another so as to be operable to control current flow from said source to said load in positive and negative directions, rspectively, on A.C. and in said positive direction on D.C. and each said solid state means comprising unidirectional current conduction means in parallel therewith for passing the current controlled by the other solid state switching means, a common control circuit for said pair of solid state switching means supplied from said source for applying turn-on signals simultaneously to the same to control current flow from said source to said load, logic signal input means for operating said common control circuit, and a power supply circuit for said common control circuit connected to and supplied from said power supply terminals and said unidirectional current conduction means of one of said solid state switching means in series with said common control circuit exclusive of said load and the other solid state switching means thereby to avoid leakage current in the load during at least alternate half-cycles of the source voltage.

BRIEF DESCRIPTION OF THE DRAWINGS

FIGS. 2A–2C are graphs showing operating characteristics of the solid state switches of FIGS. 1 and 3.

FIG. 3 is a circuit diagram of a modification of the solid state switch using SCRs and diodes in place of the FETs of FIG. 1.

DESCRIPTION OF THE PREFERRED EMBODIMENT

Figure 1:
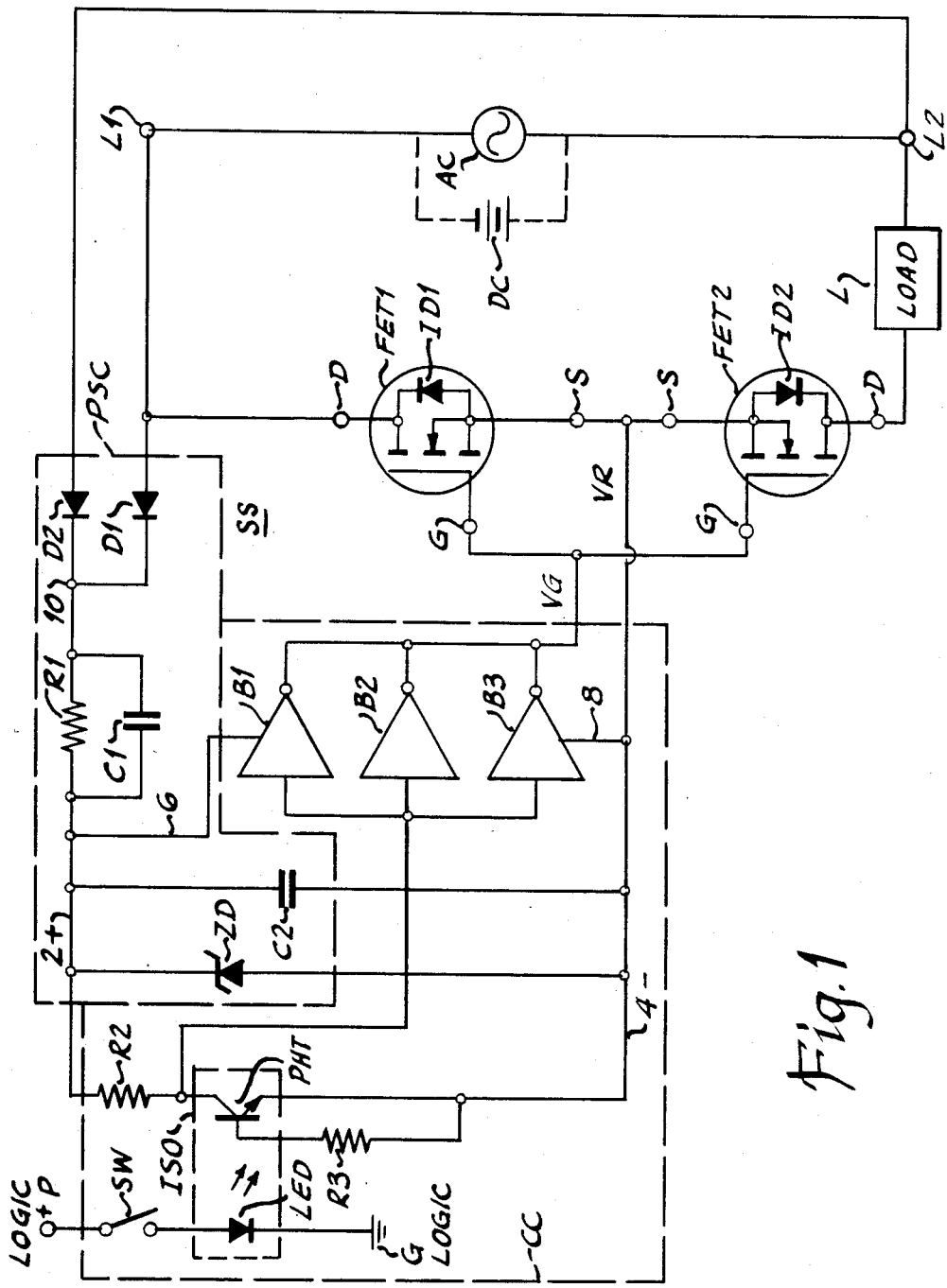
FIG. 1 is a circuit diagram of a solid state switch with control circuit and line-derived power supply therefor constructed in accordance with the invention.

Referring to FIG. 1, there is shown a solid state switch constructed in accordance with the invention. As shown therein, this switch is provided with a pair of N-channel field effect transistors or power MOSFETs FET1 and FET2 connected in series with a load L across lines L1 and L2 of an alternating current power source AC. Alternatively, the power source for this solid state switch may be a direct current source as shown by battery DC connected by broken lines between line terminals L1 and L2. The power MOSFETs are connected in opposite conductivity directions, that is, their source terminals S are connected together, drain terminal D of transistor FET1 is connected to power supply line terminal L1 and drain terminal D of transistor FET2 is connected through load L to power supply line terminal L2. Transistor FET1 has an intrinsic diode or integral body diode ID1 while transistor FET2 has a similar intrinsic diode or integral body diode ID2. From the foregoing, it will be apparent that when transistors FET1 and FET2 are turned on while line terminal L1 of the A.C. source is positive, current will flow from line L1 through transistor FET1 and integral diode ID2 of transistor FET2 and load L to line terminal L2. Alternatively, when line terminal L2 is positive and the two transistors are turned on, current will flow from line L2 through load L, transistor FET2 and integral body diode ID1 of transistor FET1 to line L1.

Transistors FET1 and FET2 are provided with a common control circuit CC for gating them on and off, this common control circuit being controlled from a logic input. For this purpose, a logic signal source is connected to positive terminal P and then through switch SW and an electrically operated light source such as a light emitting diode LED to logic ground G. An optically coupled isolator or opto-isolator ISO includes diode LED and a phototransistor PHT enclosed within a light impervious enclosure as indicated by the broken line. Consequently, when switch SW is closed to light diode LED, transistor PHT is turned on to conduct current for purposes hereinafter described.

This common control circuit CC also includes a resistor R2 connected between positive conductor 2 and the collector of transistor PHT with the emitter of this transistor being connected to negative conductor 4 and the base of this transistor being connected through a resistor R3 to negative conductor 4. The collector of phototransistor PHT is connected to the inputs of three inverting buffers B1, B2 and B3 in parallel, the outputs of which are connected to gate terminals G of transistors FET1 and FET2. While three inverting buffers are shown in FIG. 1, it will be apparent that a suitable number thereof may be employed depending on what is necessary to drive the two power FETs. Buffers B1–B3 receive operating power through conductors 6 and 8 connected across control supply conductors 2 and 4.

Solid state switch SS in FIG. 1 also includes a diode-isolated capacitive-reactively coupled line-derived power supply circuit PSC for its common control circuit. This power supply circuit includes diodes D1 and D2, resistor R1, capacitors C1 and C2 and zener diode ZD. As shown in FIG. 1, capacitor C2 and zener diode ZD are connected in parallel across conductors 2 and 4 to supply operating voltage to the buffers and phototransistor as hereinafter described. Line terminal L1 is connected through diode D1 and line terminal L2 is connected through diode D2 to junction 10, which junction 10 is then connected through resistor R1 and capacitor C1 in parallel to conductor 2. Resistor R1 and capacitor C1 constitute a high impedance capacitive-reactance-type voltage dropping device for reducing the voltage of 115 volts or the like appearing across line terminals L1 and L2 for charging voltage-storing capacitor C2 under the control of voltage regulating zener diode ZD. As will be apparent, when line L1 is positive, current flows through diode D1 and then through resistor R1 and capacitor C1 in parallel to charge capacitor C2. When line L2 is positive, current flows through diode D2 and then through resistor R1 and capacitor C1 in parallel and conductor 2 to charge capacitor C2 on the other half cycle of the alternating current and then through conductor 4 and integral body diode ID1 to line L1. Since this half-cycle bypasses load L, it avoids leakage current in the load to that extent. Also, since this current flows in parallel with the load, it prevents collapse of the control power supply whenever line L2 is positive. Zener diode ZD being a 15 volt type or the like will limit the voltage on capacitor C2, across conductors 2 and 4, and to the gate-source connections of transistors FET1 and FET2. Load L has a low impedance compared to the high impedance of resistor R1 and capacitor C1. For example, resistor R1 might have a resistance of 1 megohm while capacitor C1 might be a 200 volt device having a capacitance of 2700 pF or the like.

Let it be assumed that the solid state switch is off and line L1 is positive and line L2 is negative. Under this condition, diode D1 conducts current through resistor R1 and capacitor C1 to charge capacitor C2 to the zener voltage of diode ZD. Transistors FET1 and FET2 are non-conducting except for leakage current in intrinsic diode ID2. This establishes the reference voltage at the source terminals S of the transistors as the voltage at line L2 plus the voltage drop on intrinsic diode ID2. The gate voltage VG of the transistors, by virtue of the inverting buffers B1–B3, is also at the same value as reference voltage VR. Therefore, the two transistors FET1 and FET2 are turned off.

Assuming that the solid state switch is off and line L2 is positive, diode D2 will conduct current which then flows through resistor R1 and capacitor C1 to charge capacitor C2 to the zener voltage of diode ZD. Transistors FET1 and FET2 are non-conducting except for power supply current through integral diode ID1. This establishes the reference voltage VR as the sum of the voltage at line terminal L1 plus the voltage drop on integral diode ID1. The gate voltage VG, by virtue of the inverting buffers, is also at the same potential of line terminal L1 plus the voltage drop on intrinsic diode ID1.

When switch SW is open, the solid state switch is turned off because phototransistor PHT is off, allowing a positive voltage to be applied from conductor 2 through resistor R2 to the inputs of inverting buffers B1–B3 whereby a low voltage is applied from the outputs of the inverting buffers to gates G of the transistors to keep them turned off. When switch SW is closed, diode LED turns transistor PHT on whereby the low reference voltage is applied from conductor 4 through transistor PHT to the inputs of inverting buffers B1–B3 whereby a high voltage equivalent to that on conductor 2 is applied from the outputs of the buffers to gates G of the transistors to turn them on.

Let it now be assumed that the solid state switch is on and line terminal L1 is positive and line terminal L2 is negative. As a result, capacitor C2 charges through diode D1 as hereinbefore described. Transistor FET1 conducts in a normal manner with the current flowing also through integral diode ID2 of transistor FET2 and load L to energize load L. Gate voltage VG is now the sum of the voltage at line terminal L2 plus the voltage across load L plus the voltage across integral diode ID2 plus the voltage on zener diode ZD. Reference voltage VR is the sum of the voltage on line terminal L2 plus the voltage on load L and the voltage on integral diode ID2. If the voltage on zener diode ZD is 15 volts as hereinbefore assumed, for example, then as long as the voltage on line terminal L1 is greater than 15 volts, the control power supply is maintained and the common control circuit functions in a normal manner.

Let it now be assumed that the solid state switch is on, line terminal L2 is positive and line terminal L1 is negative. As a result, current flows through diode D2 to charge capacitor C2 as hereinbefore described. Under this condition, transistor FET2 conducts in the normal manner with the current flowing also through integral diode ID1 of transistor FET1. Gate voltage VG is now the sum of the voltage at line terminal L1 plus the voltage on integral diode ID1 plus the voltage on diode ZD. Reference voltage VR is the sum of the voltage on line terminal L1 plus the voltage on integral diode ID1. If the voltage on zener diode ZD is 15 volts as hereinbefore assumed, then as long as the voltage on line terminal L2 is greater than 15 volts, diode D2 will conduct to maintain the control power supply so that the common control circuit functions in a normal manner.

From the foregoing, it will be apparent that at points within 15 volts of the zero voltage crossing of the A.C. line, neither diode D1 nor diode D2 is forward biased. It is during this time that capacitor C2 supplies current to maintain the common control circuit power supply voltage. Also, during the periods when the buffers and FETs are switched from their low (off) to their high (on) states, large currents are required and capacitor C2, by virtue of its stored energy, supplies most of this current.

The circuit of FIG. 1 will also function as a direct current solid state switch when source DC is substituted between line terminals L1 and L2 in place of source AC. Source DC is connected with the polarity shown in FIG. 1 so that when the FETs are turned on, current will flow through load L, transistor FET2 and integral diode ID1 in series to energize the load. Also, control power supply current will flow through line terminal L2, diode D2 and resistor R1 to charge capacitor C2 to the zener voltage of diode ZD. Source DC must be connected to the polarity shown in FIG. 1 to avoid the possibility of conducting FET1 dropping the voltage applied to capacitor C2 and thus allowing it to discharge through phototransistor PHT.

While capacitor C1 is shown in FIG. 1 as connected across resistor R1 to provide a reactive voltage dropping device for the control power supply, it will be apparent that the circuit would function without capacitor C1, the difference being that less energy will be dissipated with capacitor C1 in the cicuit than would be dissipated by resistor R1 alone.

In the modification shown in FIG. 3, reference characters like those used in FIG. 1 have been used for like elements. The modification shown in FIG. 3 differs from that shown in FIG. 1 in that capacitor C1 has been omitted and silicon controlled rectifiers SCR1 and SCR2 along with respective reverse-parallel connected diodes D3 and D4 have been used in place of field effect transistors FET1 and FET2 shown in FIG. 1 and inverting buffers B1-B3 have been omitted so that the collector of phototransistor PHT in opto-isolator ISO has been connected through an inverter INV to the gates of silicon controlled rectifiers SCR1 and SCR2. With those exceptions, the circuit of FIG. 3 functions in a substantially similar manner on A.C. as the circuit in FIG. 1 hereinbefore described. While controlled rectifiers and reverse-parallel connected diodes have been shown in FIG. 3, it will be apparent that asymmetric SCRs or any other devices that exhibit a high controlled forward blocking state and a low uncontrolled reverse blocking state could be used in place thereof for A.C. operation and gate turn-on turn-off devices of that type could be used for A.C. and D.C. operation.

The graph in FIG. 2 shows operating characteristics of the circuits shown in FIGS. 1 and 3. This graph will be described in connection with the circuit of FIG. 3 with reference to voltage points A, B, L1 and L2 indicated in FIG. 3. Curve (a) in FIG. 2 shows the line-derived control power supply D.C. voltage VA appearing at point A with respect to point B in FIG. 3. As will be apparent, this voltage VA will be a constant 15 volts or the like depending upon the rating of zener diode ZD used therein.

Curves (b) in the graph of FIG. 2 show a sine wave which represents the voltage between line terminals L1 and L2 and also shows a curve which represents the voltage VB at point B in FIG. 3. It will be apparent from these curves that during the first half cycle, voltage VB will be displaced from the line terminal L1 voltage by the voltage drop of diode D3. During the next half cycle, voltage VB at point B in FIG. 3 is again displaced by the voltage drop of diode D3 from the voltage at line terminal L1, the large voltage difference between line terminal L2 and voltage VB being the voltage drop across diode D4 plus the voltage drop across load L. From these curves (b), it will be apparent that the voltage at point B in the circuit of FIG. 3 tracks the voltage at line terminal L1 by a one diode drop displacement.

The curves (c) in the graph of FIG. 2 illustrate the voltage at point A in the circuit of FIG. 3 relative to the line L1 voltage. As shown therein, the control circuit power supply voltage VA tracks the line terminal L1 voltage by a difference of 15 volts plus the voltage drop across diode D3 which is 0.6 volts or the like.

While the apparatus hereinbefore described is effectively adapted to fulfill the objects stated, it is to be understood that the invention is not intended to be confined to the particular preferred embodiment of solid state switch with control circuit and line-derived power supply therefor disclosed, inasmuch as it is susceptible of various modifications without departing from the scope of the appended claims.

We claim:

1. A solid state switch having an improved line-derived control circuit power supply and being operable to control either a D.C. or A.C. load supplied from a respective D.C. or A.C. electrical power supply source comprising:

a pair of power supply terminals to which either said D.C. or A.C. electrical power supply source is connected;

a pair of solid state switching means connected in series with each other and said power supply terminals and said D.C. or A.C. load and being opposed with respect to one another so as to be operable to control current flow from said source to said load in positive and negative directions, respectively, on A.C. and in said positive direction on D.C. and each said solid state switching means comprising unidirectional current conducting means in parallel therewith for passing the current controlled by the other solid state switching means;

a common control circuit for said pair of solid state switching means supplied from said source for applying turn-on signals simultaneously to the same to control current flow from said source to said load;

external selectively controllable on-off logic signal input means for operating said common control circuit;

and a power supply circuit for said common control circuit connected to and supplied from said power supply terminals and including means connecting said power supply terminals and said unidirectional current conducting means of one of said solid state switching means in series to said common control circuit exclusive of said load and the other solid state switching means thereby to avoid leakage current in the load during at least alternate half-cycles of the source voltage;

said power supply circuit comprising a diode-isolated, capacitive-reactively coupled voltage dropping line power supply to said common control circuit.

2. The solid state switch claimed in claim 1, wherein:

said capacitive-reactively coupled voltage dropping line power supply comprises a high impedance voltage dropping means.

3. The solid state switch claimed in claim 2, wherein:

said high impedance voltage dropping means comprises a resistor and a capacitor connected in parallel.

4. The solid state switch claimed in claim 1, wherein:

said pair of solid state switching means comprise a pair of three terminal controlled devices each having a pair of power terminals and a control terminal;

said common control circuit comprises a control output connected in parallel across said control terminal and one of said power terminals of both of said three terminal controlled devices.

5. The solid state switch claimed in claim 4, wherein:

said pair of controlled devices comprise a pair of FETs and said unidirectional current conducting means therein comprises intrinsic diodes in said FETs.

6. The solid state switch claimed in claim 4, wherein said common control circuit comprises:

an optically coupled isolator connected to said logic signal input means;

and buffer means connecting said optically coupled isolator to said control terminal and said one power terminal of both said controlled devices.

7. A solid state switch operable to control either an A.C. or D.C. load supplied from a respective A.C. or a D.C. power supply line comprising:

a pair of power supply terminals to which either said A.C. or D.C. power supply line is connected;

a pair of controlled solid state devices connected in series to one of said power supply terminals and through a load to the other of said power supply terminals said solid state devices being opposed with respect to one another so as to be operable to control current flow from said power supply line to said load in opposite polarity directions, respectively, on A.C. and in one of said polarity directions on D.C. and each said solid state device comprising undirectional current conducting means for passing the current controlled by the other solid state device;

a common control circuit for said pair of solid state devices for operating the same to control current flow from said line to said load;

external selectively controllable on-off opto-isolated logic input means for said common control circuit;

and a diode-isolated line-derived power supply circuit for said common control circuit including means effective when connectd to an A.C. power supply line for supplying half-cycles of power through the unidirectional current conduction means of one of said solid state devices to said common control circuit in parallel with said load when said solid state devices are being operated to prevent collapse of the control power supply;

said power supply circuit comprising a diode-isolated capacitive-reactively coupled voltage dropping line power supply to said common control circuit.

* * * * *